United States Patent
Yang et al.

(10) Patent No.: US 10,634,387 B2
(45) Date of Patent: Apr. 28, 2020

(54) SOLAR SELECTIVE ABSORBING COATING AND PREPARATION METHOD THEREOF

(71) Applicant: China Building Materials Academy, Beijing (CN)

(72) Inventors: Zhongzhou Yang, Beijing (CN); Jing Liu, Beijing (CN); Zhiqiang Sun, Beijing (CN); Hong Wang, Beijing (CN)

(73) Assignee: CHINA BUILDING MATERIALS ACADEMY, Beijing (CN)

( * ) Notice: Subject to any disclaimer, the term of this patent is extended or adjusted under 35 U.S.C. 154(b) by 265 days.

(21) Appl. No.: 15/415,072

(22) Filed: Jan. 25, 2017

(65) Prior Publication Data
US 2018/0058726 A1 Mar. 1, 2018

(30) Foreign Application Priority Data
Aug. 26, 2016 (CN) .......................... 2016 1 0741973

(51) Int. Cl.
*F24S 70/25* (2018.01)
*C23C 14/08* (2006.01)
(Continued)

(52) U.S. Cl.
CPC .............. *F24S 70/25* (2018.05); *C03C 17/36* (2013.01); *C03C 17/366* (2013.01);
(Continued)

(58) Field of Classification Search
CPC ......... F24S 70/25; F24S 70/225; C23C 14/08; C23C 14/35; C23C 14/0676;
(Continued)

(56) References Cited

U.S. PATENT DOCUMENTS

2018/0076342 A1    3/2018   Liu et al.

FOREIGN PATENT DOCUMENTS

| CN | 102620456 A | * | 8/2012 | .............. F24S 70/20 |
| CN | 102786231 A | | 11/2012 | |

(Continued)

OTHER PUBLICATIONS

EPO Machine Translation of DE-102013101106-A1 (Year: 2019).*
(Continued)

*Primary Examiner* — Michael Zhang
(74) *Attorney, Agent, or Firm* — Birch, Stewart, Kolasch & Birch, LLP

(57) ABSTRACT

The invention relates to a solar selective absorbing coating and a preparation method thereof. The solar selective absorbing coating comprises a substrate, an infrared reflective layer, an absorbing layer and an antireflective layer in sequence from bottom to surface. The absorbing layer consists of a first sublayer, a second sublayer and a third sublayer. The first sublayer and the second sublayer contain metal nitride, and the third sublayer is metal oxynitride. The first sublayer is in contact with the infrared reflective layer, and the third sublayer is in contact with the antireflective layer. The preparation method comprises: depositing an infrared reflective layer on a substrate; depositing an absorbing layer on the infrared reflective layer; and depositing the antireflective layer on the absorbing layer. According to the metal nitride (oxynitride) solar selective absorbing coating, the working temperature of the metal nitride (oxynitride) solar selective absorbing coating is increased, the preparation is simple, and the coating is suitable for large-scale production.

7 Claims, 1 Drawing Sheet

(51) Int. Cl.
- *F24S 70/225* (2018.01)
- *C03C 17/36* (2006.01)
- *C23C 14/00* (2006.01)
- *C23C 14/06* (2006.01)
- *C23C 14/34* (2006.01)
- *C23C 14/35* (2006.01)

(52) U.S. Cl.
CPC ...... *C03C 17/3626* (2013.01); *C03C 17/3649* (2013.01); *C23C 14/0036* (2013.01); *C23C 14/0641* (2013.01); *C23C 14/0676* (2013.01); *C23C 14/08* (2013.01); *C23C 14/3485* (2013.01); *C23C 14/35* (2013.01); *F24S 70/225* (2018.05); *C03C 2217/734* (2013.01)

(58) Field of Classification Search
CPC ............ C23C 14/0641; C23C 14/0036; C23C 14/3485; C03C 17/00
See application file for complete search history.

(56) References Cited

FOREIGN PATENT DOCUMENTS

| | | | | |
|---|---|---|---|---|
| CN | 204535163 U | * | 8/2015 | |
| CN | 105299935 A | | 2/2016 | |
| CN | 206222719 U | | 6/2017 | |
| DE | 202005006478 U1 | * | 7/2005 | .............. F24S 70/20 |
| DE | 102013101106 A1 | * | 7/2014 | .............. F24S 70/20 |

OTHER PUBLICATIONS

EPO Machine Translation of CN-102620456-A (Year: 2019).*
Google Patent Machine Translation of DE-202005006478-U1 (Year: 2019).*
Chinese Office Action for Chinese Application No. 201610741973.X, dated Aug. 1, 2018, with English translation.
Chinese Office Action for Chinese Application No. 201610741973.X, dated Dec. 7, 2017, with English translation.

* cited by examiner

SOLAR SELECTIVE ABSORBING COATING AND PREPARATION METHOD THEREOF

TECHNICAL FIELD

The present disclosure relates to a coating, in particular to a solar selective absorbing coating and a preparation method thereof.

BACKGROUND

Solar selective absorbing coating is a key material of photothermal conversion of solar collectors, which has high absorptance in solar bands with the wavelength range from 0.3 μm to 2.5 μm and low emittance in infrared thermal radiation bands with the wavelength range from 2.5 μm to 50 μm. Therefore, heat radiation with high absorptance and low emittance can be realized, and solar energy can be converted into heat energy as much as possible. The selective absorbing coating can be categorized as low-temperature coating (lower than 100° C.), mid-temperature coating (100° C.–400° C.), and high-temperature coating (higher than 400° C.) according to different working temperatures. The low-temperature coating is mainly used in solar water heaters, the mid-temperature coating is mainly used for industrial process heat production, seawater desalination and solar water heaters, and the high-temperature coating is mainly used for concentrated solar power generation.

The higher the working temperature of the solar collector, the higher requirements of the thermal and oxidation resistance, and high-low temperature cycling stability for the selective absorbing coating. Metal nitride (oxynitride) is one of the most common spectrally selective absorbing coatings, but the spectrally selective absorbing coating based on absorption of metal nitride (oxynitride) is mainly applied in the mid-low temperature field since the performance of the spectrally selective absorbing coating based on absorption of metal nitride (oxynitride) deteriorates with the increase of the working temperature. The main cause of deterioration are as follows: 1) the diffusion between an infrared reflective metal layer and a metal nitride (oxynitride) absorbing layer occurs, resulting in the increase of the emittance and decrease of the absorptance; and 2) the metal nitride (oxynitride) is oxidized in an atmospheric environment, resulting in the decrease of the absorptance.

Therefore, the working temperature of the spectrally selective absorbing coating based on absorption of metal nitride (oxynitride) needs to be increased.

SUMMARY

An object of the present invention is to provide a solar selective absorbing coating and a preparation method thereof, and a technical problem to be solved is to increase the working temperature of the spectrally selective absorbing coating based on absorption of metal nitride (oxynitride) so that the coating is more suitable for application.

The object and the solution of the technical problem are implemented by adoption of the following technical scheme.

According to the solar selective absorbing coating of the present invention, the coating comprises a substrate, an infrared reflective layer, an absorbing layer and an antireflective layer from bottom to surface. The absorbing layer consists of a first sublayer, a second susblayer, and a third sublayer, the first sublayer and the second sublayer contain metal nitride, the third sublayer is metal oxynitride, the first sublayer is in contact with the infrared reflective layer, and the third sublayer is in contact with the antireflective layer.

The object and the solution of the technical problem are further implemented by adoption of the following technical measures.

Preferably, according to the solar selective absorbing coating, the first sublayer is metal nitride with incomplete nitridation, the second sublayer is metal nitride, and the third sublayer is metal oxynitride.

Preferably, according to the solar selective absorbing coating, the first sublayer is $CrN_x$, wherein $0<x<1$, and x is the atom number ratio of element N to element Cr; the second sublayer is $CrN_y$, wherein $1 \leq y \leq 1.5$, and y is the atom number ratio of element N to element Cr; and the third sublayer is $CrN_mO_n$, wherein $0<m \leq 1.5$, $0<n \leq 2$, m is the atom number ratio of element N to element Cr, and n is the atom number ratio of element O to element Cr.

Preferably, according to the solar selective absorbing coating, the thickness of the first sublayer is 20-40 nm, the thickness of the second sublayer is 25-60 nm, and the thickness of the third sublayer is 30-60 nm.

Preferably, according to the solar selective absorbing coating, the substrate is made of glass, aluminum, copper or stainless steel; the infrared reflective layer is one or a combination of two or more selected from a group consisting of Al, Cu, W, Mo, Au, Ag and Ni; and the antireflective layer is one or a combination of two or more selected from a group consisting of $SiO_2$, $Si_3N_4$, $Al_2O_3$, $ThO_2$, $Dy_2O_3$, $Eu_2O_3$, $Gd_2O_3$, $Y_2O_3$, $La_2O_3$, MgO and $Sm_2O_3$.

Preferably, according to the solar selective absorbing coating, the thickness of the infrared reflective layer is 80-200 nm, the thickness of the absorbing layer is 75-160 nm, and the thickness of the antireflective layer is 50-150 nm.

The object and the solution of the technical problem are further implemented by adoption of the following technical scheme.

According to the invention, a preparation method of a solar selective absorbing coating comprises: depositing an infrared reflective layer on a substrate; depositing an absorbing layer on the infrared reflective layer; and depositing an antireflective layer on the absorbing layer; wherein the absorbing layer consists of a first sublayer, a second sublayer, and a third sublayer; the first sublayer and the second sublayer contain metal nitride; and the third sublayer is metal oxynitride.

Preferably, according to the preparation method of the solar selective absorbing coating, the first sublayer is metal nitride with incomplete nitridation, the second sublayer is metal nitride, and the third sublayer is metal oxynitride.

Preferably, according to the preparation method of the solar selective absorbing coating, the first sublayer is $CrN_x$, wherein $0<x<1$, and x is the atom number ratio of element N to element Cr; the second sublayer is $CrN_y$, wherein $1 \leq y \leq 1.5$, and y is the atom number ratio of element N to element Cr; and the third sublayer is $CrN_mO_n$, wherein $0<m \leq 1.5$, $0<n \leq 2$, m is the atom number ratio of element N to element Cr, and n is the atom number ratio of element O to element Cr.

Preferably, according to the preparation method of the solar selective absorbing coating, the thickness of the first sublayer is 20-40 nm, the thickness of the second sublayer is 25-60 nm, and the thickness of the third sublayer is 30-60 nm.

Preferably, according to the preparation method of the solar selective absorbing coating, the substrate is made of glass, aluminum, copper or stainless steel; the infrared reflective layer is one or a combination of two or more selected from a group consisting of Al, Cu, W, Mo, Au, Ag and Ni; and the antireflective layer is one or a combination of two or more selected from a group consisting of $SiO_2$, $Si_3N_4$, $Al_2O_3$, $ThO_2$, $Dy_2O_3$, $Eu_2O_3$, $Gd_2O_3$, $Y_2O_3$, $La_2O_3$, MgO and $Sm_2O_3$.

Preferably, according to the preparation method of the solar selective absorbing coating, the thickness of the infrared reflective layer is 80-200 nm, the thickness of the absorbing layer is 75-160 nm, and the thickness of the antireflective layer is 50-150 nm.

Preferably, according to the preparation method of the solar selective absorbing coating, the method comprises: the infrared reflective layer is deposited on the substrate through pulsed direct current magnetron sputtering in the inert gas condition; the first sublayer of the absorbing layer is deposited on the infrared reflective layer through pulsed direct current magnetron sputtering with feeding of nitrogen in the inert gas condition; the second sublayer of the absorbing layer is deposited on the first sublayer through pulsed direct current magnetron sputtering with feeding of nitrogen in the inert gas condition; the third sublayer of the absorbing layer is deposited on the second sublayer through pulsed direct current magnetron sputtering with feeding of nitrogen and oxygen in the inert gas condition; and the antireflective layer is deposited on the third sublayer through pulsed direct current magnetron sputtering with feeding of nitrogen or oxygen in the inert gas condition.

Preferably, according to the preparation method of the solar selective absorbing coating, the inert gas is argon.

By means of the above technical schemes, the solar selective absorbing coating and the preparation method thereof at least have following advantages.

1. The present invention provides a metal nitride (oxynitride) solar selective absorbing coating, and the working temperature of the metal nitride (oxynitride) solar selective absorbing coating is increased.

According to the solar selective absorbing coating, the coating comprises a substrate, an infrared layer, an absorbing layer and an antireflective layer in sequence from bottom to surface, and the absorbing layer comprises three layers: a metal nitride layer with incomplete nitridation, a metal nitride layer and a metal oxynitride layer in sequence so that the absorbing coating has high absorptance in the solar spectral range from 0.3 µm to 2.5 µm and low emittance in the thermal radiation infrared region from 2.5 µm to 48 µm, the interfacial stress between the infrared reflective layer and the absorbing layer can be effectively reduced, the adhesion between different layers of the coating is improved, the thermal stability of the selective absorbing coating can be improved, and the working temperature of the metal nitride (oxynitride) solar selective absorbing coating is increased.

2. According to the solar selective absorbing coating, the metal nitride layer with incomplete nitridation in the absorbing layer is an absorbing sublayer and also acts as a barrier layer, the diffusion between the infrared reflective layer and the absorbing layer is blocked, and the absorbing property and the thermal stability of the coating are effectively improved.

3. Further, according to the solar selective absorbing coating, the absorbing layer is made by adopting single-metal nitride and oxynitride, the cost of the employed material is low, the process is simple, and the coating is suitable for large-scale production.

The above description is the general description of the technical scheme of the prevent invention, in order to more clearly introduce the technical method of the present invention and perform implementation according to the description, the preferred embodiments of the present invention are described in details below and with reference to the drawings.

DETAILED DESCRIPTION

To further illustrate the technical schemes and effect of the present invention, the embodiments, structures and characteristics of a solar selective absorbing coating and a preparation method thereof proposed according to the invention are described below in details with the combination of the accompanying drawings and preferred embodiments. In the following description, different "one embodiment" or "embodiment" do not necessarily refer to the same embodiment. In addition, specific features, structures or characteristics in one or more embodiments can be combined in any proper form.

Embodiment 1

This embodiment provides a solar selective absorbing coating, and the coating comprises a substrate, an infrared reflective layer, an absorbing layer and an antireflective layer in sequence from bottom to surface. The absorbing layer consists of a first sublayer, a second sublayer, and a third sublayer, the first sublayer and the second sublayer contain metal nitride, the third sublayer is metal oxynitride, the refractive indexes and the extinction coefficients of the metal nitride of the first sublayer, the metal nitride of the second sublayer, and the metal oxynitride of the third sublayer of the absorbing layer are reduced in sequence, the first sublayer is in contact with the infrared reflective layer, and the third sublayer is in contact with the antireflective layer. The first sublayer is metal nitride with incomplete nitridation, the second sublayer is metal nitride, and the third sublayer is metal oxynitride. The metal nitride with incomplete nitridation of the present invention is the metal nitride which is a product of incomplete reaction of metal and nitrogen, that is to say, the metal nitride with incomplete nitridation is the compound of metal and metal nitride.

The absorbing coating of this embodiment has high absorptance in the solar spectral range from 0.3 µm-2.5 µm and low emittance in the thermal radiation infrared region from 2.5 µm to 48 µm, and effectively reduces interfacial stress between the infrared layer and the absorbing layer, resulting in a good adhesion between layers of the coating; therefore, the thermal stability of the selective absorbing coating can be improved, and the working temperature of the metal nitride (oxynitride) solar selective absorbing coating is increased.

Embodiment 2

Figure 1:
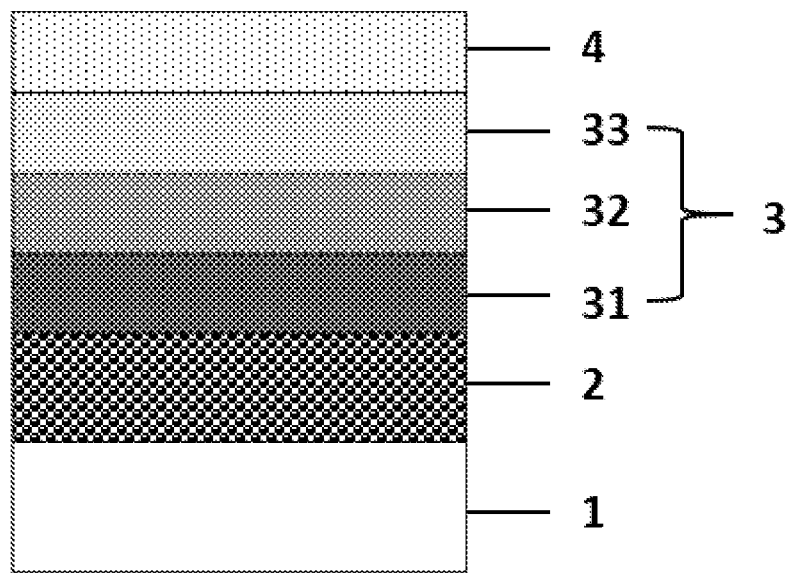
FIG. 1 is a structural schematic diagram of a solar selective absorbing coating of the present invention, wherein 1—substrate, 2—infrared reflective layer, 3—absborbing layer, 31—first sublayer, 32—second sublayer, 33—third sublayer, 4—antireflective layer.

This embodiment provides a solar selective absorbing coating, as shown in FIG. 1, the coating comprises a substrate 1, an infrared reflective layer 2, an absorbing layer 3 (including a first sublayer 31, a second sublayer 32 and a third sublayer 33), and an antireflective layer 4.

Wherein, the substrate is an aluminum substrate with a thickness of 0.5 mm.

The infrared reflective layer is an Al layer with a thickness of 200 nm.

The absorbing layer comprises the first sublayer, the second sublayer, and the third sublayer in sequence from bottom to top; the first sublayer is $CrN_x$, wherein 0<x<1) and x is the atom number ratio of element N to element Cr; the second sublayer is $CrN_y$, wherein 1≤y≤1.5, and y is the atom number ratio of element N to element Cr; and the third sublayer is $CrN_mO_n$, wherein 0<m≤1.5, 0<n≤2, m is the atom number ratio of element N to element Cr, and n is the atom number ratio of element O to element Cr. The total thickness of the absorbing layer is 125 nm, wherein the thickness of the first sublayer is 30 nm, the thickness of the second sublayer is 45 nm, and the thickness of the third sublayer is 50 nm.

The antireflective layer is $SiO_2$ with a thickness of 90 nm.

The solar selective absorbing coating is prepared by employing the following method:

1) pre-treating the substrate:

firstly, the substrate is preliminarily cleaned by using a neutral detergent solution and deionized water; then the substrate is cleaned for the second time in an entrance chamber of coating equipment through bombardment on the surface of the substrate by a RF ion source, and the pre-treated substrate is obtained; and the process parameters are as follows: the RF power supply sputtering power is 200 w, the working gas is Ar with a purity of 99.99% and a flow rate of 45 sccm, the working pressure is $9.8 \times 10^{-2}$ mTorr, and the sputtering time is 360 s;

2) depositing the Al layer on the substrate as the infrared reflective layer:

an Al target with a purity of 99.7% is selected, and an Al film is deposited on the substrate as the infrared reflective layer through bombardment of the aluminum target with a purity of 99.7% through pulsed direct current power supply magnetron sputtering with feeding of an inert working gas Ar with a purity of 99.99%; and the process parameters are set as follows: the pulsed direct current power supply sputtering power is 1200 w, the flow rate of the working gas is 50 sccm, the working pressure is 5 mTorr, the moving speed of the substrate is 0.4 m/min, the substrate is moved back and forth 5 times under the Al target, and the temperature is room temperature;

3) depositing the first sublayer $CrN_x$, layer, the second sublayer $CrN_y$, layer, and the third sublayer $CrN_mO_n$ layer on the Al/substrate in sequence:

a Cr target with a purity of 99.7% is selected, and the first sublayer $CrN_x$ layer, the second sublayer $CrN_y$ layer, and the third sublayer $CrN_mO_n$ layer are deposited on the Al/substrate in sequence through bombardment of the Cr target through pulsed direct current power supply magnetron sputtering with feeding of the inert working gas Ar, first reaction gas $N_2$, and second reaction gas $O_2$ all with the purity of 99.99% in sequence;

the process parameters for depositing the first sublayer $CrN_x$ layer are set as follows: the pulsed direct current power supply sputtering power is 1500 w, the working pressure is 3 mTorr, the flow rate of the working gas Ar is 50 sccm, the flow rate of the first reaction gas $N_2$ is 10 sccm, the moving speed of the Al/substrate is 1 m/min, the Al/substrate is moved back and forth twice under the Cr target, and the temperature is room temperature;

the process parameters for depositing the second sublayer $CrN_y$ layer are set as follows: the pulsed direct current power supply sputtering power is 1500 w, the working pressure is 3 mTorr, the flow rate of the working gas Ar is 50 sccm, the flow rate of the first reaction gas $N_2$ is 50 sccm, the moving speed of the $CrN_x$/Al/substrate is 2 m/min, the $CrN_x$/Al/substrate is moved back and forth 7 times under the Cr target, and the temperature is room temperature;

the process parameters for depositing the third sublayer $CrN_mO_n$ layer are set as follows: the pulsed direct current power supply sputtering power is 1500 w, the working pressure is 3 mTorr, the flow rate of the working gas Ar is 50 sccm, the flow rate of the first reaction gas $N_2$ is 50 sccm, the flow rate of the second reaction gas $O_2$ is 10 sccm, the moving speed of the $CrN_y$/$CrN_x$/Al/substrate is 0.45 m/min, the $CrN_y$/$CrN_x$/Al/substrate is moved back and forth 5 times under the Cr target, and the temperature is room temperature;

4) depositing the antireflective layer on the $CrN_mO_n$/$CrN_y$/$CrN_x$/Al/substrate:

an silicon-aluminum target with an Al content of 30 wt % and a purity of 99.7% is selected, $SiO_2$ is deposited on the $CrN_mO_n$/$CrN_y$/$CrN_x$/Al/substrate as the antireflective layer through bombardment of the silicon-aluminum target through pulsed direct current power supply magnetron sputtering with feeding of the inert working gas Ar with a purity of 99.99% and third reaction gas $O_2$, and the process parameters are set as follows: the pulsed direct current power supply sputtering power is 2000 w, the working pressure is 5 mTorr, the flow rate of the working gas is 30 sccm, the flow rate of the third reaction gas $O_2$ is 14 sccm, the moving speed of the $CrN_mO_n$/$CrN_y$/$CrN_x$/Al/substrate is 1 m/min, the $CrN_mO_n$/$CrN_y$/$CrN_x$/Al/substrate is moved back and forth 9 times under the silicon-aluminum target, and the temperature is room temperature; and 5) cooling a sample for 20 min after the completion of the above preparing steps, discharging the sample, and shutting down.

The absorptance α in the band from 0.3 μm to 2.5 μm is tested by using a Hitachi U-4100 spectrophotometer, the emittance ε in the band from 2.5 μm to 48 μm is tested by using a Bruker Tensor27 Fourier infrared spectrometer, and the testing results are shown in Table 1.

The absorptance α and the emittance ε of the coating prepared in this embodiment after annealing at 250° C., 400° C. and 500° C. for different times are detected, and the results are shown in Table 2.

Embodiment 3

This embodiment provides a solar selective absorbing coating, as shown in FIG. 1, the coating comprises a substrate 1, an infrared reflective layer 2, an absorbing layer 3 (including a first sublayer 31, a second sublayer 32 and a third sublayer 33) and an antireflective layer 4. The substrate is glass with a thickness of 6 mm, and the infrared reflective layer is an Al layer with a thickness of 100 nm.

The absorbing layer comprises the first sublayer, the second sublayer and the third sublayer in sequence from bottom to top; the first sublayer is $CrN_x$, wherein 0<x<1, and x is the atom number ratio of element N to element Cr; the second sublayer is $CrN_y$, wherein 1<y≤1.5, and y is the atom number ratio of element N to element Cr; and the third sublayer is $CrN_mO_n$, wherein 0<m≤1.5, 0<n≤2, m is the atom number ratio of element N to element Cr, and n is the atom number ratio of element O to element Cr. The total thickness of the absorbing layer is 120 nm, wherein the thickness of the first sublayer is 40 nm, the thickness of the second sublayer is 40 nm, and the thickness of the third sublayer is 40 nm.

The antireflective layer consists of $Si_3N_4$ and $SiO_2$ with the corresponding thicknesses of 20 nm and 130 nm, respectively.

The solar selective absorbing coating is prepared by employing the following method:

1) pre-treating the substrate:
firstly, the substrate is preliminarily cleaned by using a neutral detergent solution and deionized water; then the substrate is cleaned for the second time in an entrance chamber of coating equipment through bombardment on the surface of the substrate by a RF ion source, and the pre-treated substrate is obtained; and the process parameters are as follows: the RF power supply sputtering power is 200 w, the working gas is Ar with a purity of 99.99% and a flow rate of 45 sccm, the working pressure is $9.8 \times 10^{-2}$ mTorr, and the sputtering time is 360 s.

2) depositing the Al layer on the substrate as the infrared reflective layer: an Al target with a purity of 99.7% is selected, and an Al film is deposited on the substrate as the infrared reflective layer through bombardment of the Al target with the purity of 99.7% through pulsed direct current power supply magnetron sputtering with feeding of an inert working gas Ar with a purity of 99.99%; and the process parameters are set as follows: the pulsed direct current power supply sputtering power is 1200 w, the flow rate of the working gas is 50 sccm, the working pressure is 5 mTorr, the moving speed of the substrate is 0.8 m/min, the substrate is moved back and forth 5 times under the Al target, and the temperature is room temperature;

3) depositing the first sublayer $CrN_x$ layer, the second sublayer $CrN_y$ layer, and the third sublayer $CrN_mO_n$ layer on the Al/glass substrate:
a Cr target with a purity of 99.7% is selected, and the first sublayer $CrN_x$ layer, the second sublayer $CrN_y$ layer and the third sublayer $CrN_mO_n$ layer are deposited on the Al/substrate in sequence through bombardment of the Cr target through pulsed direct current power supply magnetron sputtering with feeding of the inert working gas Ar, first reaction gas $N_2$, and second reaction gas $O_2$ all with a purity of 99.99% in sequence;
the process parameters for depositing the first sublayer $CrN_x$ layer are set as follows: the pulsed direct current power supply sputtering power is 1500 w, the working pressure is 3 mTorr, the flow rate of the working gas Ar is 50 sccm, the flow rate of the first reaction gas $N_2$ is 10 sccm, the moving speed of the Al/substrate is 1.5 m/min, the Al/substrate is moved back and forth 4 times under the Cr target, and the temperature is room temperature;
the process parameters for depositing the second sublayer $CrN_y$ layer are set as follows: the pulsed direct current power supply sputtering power is 1500 w, the working pressure is 3 mTorr, the flow rate of the working gas Ar is 50 sccm, the flow rate of the first reaction gas $N_2$ is 50 sccm, the moving speed of the $CrN_x$/Al/substrate is 0.95 m/min, the $CrN_x$/Al/substrate is moved back and forth 3 times under the Cr target, and the temperature is room temperature;
the process parameters for depositing the third sublayer $CrN_mO_n$ layer are set as follows: the pulsed direct current power supply sputtering power is 1500 w, the working pressure is 3 mTorr, the flow rate of the working gas Ar is 50 sccm, the flow rate of the first reaction gas $N_2$ is 50 sccm, the flow rate of the second reaction gas $O_2$ is 10 sccm, the moving speed of the $CrN_y$/$CrN_x$/Al/substrate is 0.45 m/min, the $CrN_y$/$CrN_x$/Al/substrate is moved back and forth 4 times under the Cr target, and the temperature is room temperature;

4) depositing the antireflective layer $Si_3N_4$ and $SiO_2$ on the $CrN_mO_n$/$CrN_y$/$CrN_x$/Al/substrate:
an silicon-aluminum target with an Al content of 30 wt % and a purity of 99.7% is selected, $Si_3N_4$ and $SiO_2$ are deposited on the $CrN_mO_n$/$CrN_y$/$CrN_x$/Al/substrate as the antireflective layer through bombardment of the silicon-aluminum target through pulsed direct current power supply magnetron sputtering with feeding of the inert working gas Ar with a purity of 99.99% and third reaction gas $N_2$ (or $O_2$);
the process parameters for depositing $Si_3N_4$ are set as follows: the pulsed direct current power supply sputtering power is 1300 w, the working pressure is 2.5 mTorr, the flow rate of the working gas is 30 sccm, the flow rate of the third reaction gas $O_2$ is 24 sccm, the moving speed of the $CrN_mO_n$/$CrN_y$/$CrN_x$/Al/substrate is 0.55 m/min, the $CrN_mO_n$/$CrN_y$/$CrN_x$/Al/substrate is moved back and forth once under the silicon-aluminum target, and the temperature is room temperature;
the process parameters for depositing $SiO_2$ are set as follows: the pulsed direct current power supply sputtering power is 2000 w, the working pressure is 5 mTorr, the flow rate of the working gas is 30 sccm, the flow rate of the third reaction gas $O_2$ is 14 sccm, the moving speed of the $Si_3N_4$/$CrN_mO_n$/$CrN_y$/$CrN_x$/Al/substrate is 1 m/min, the $Si_3N_4$/$CrN_mO_n$/$CrN_y$/$CrN_x$/Al/substrate is moved back and forth 13 times under the silicon-aluminum target, and the temperature is room temperature; and 5) cooling a sample for 20 min after the completion of the above preparing steps, discharging the sample, and shutting down.

The absorptance α in the band from 0.3 μm to 2.5 μm is tested by using a Hitachi U-4100 spectrophotometer, the emittance ε in the band from 2.5 μm to 48 μm is tested by using a Bruker Tensor27 Fourier infrared spectrometer, and the testing results are shown in Table 1.

Embodiment 4

Refer to the preparation method of the solar selective absorbing coating in embodiment 2 and embodiment 3, according to a coating prepared in this embodiment, the thickness of the first sublayer of the absorbing layer is 40 nm, the thickness of the second sublayer is 25 nm, and the thickness of the third sublayer is 30 nm.

Embodiment 5

Refer to the preparation method of the solar selective absorbing coating in embodiment 2 and embodiment 3, according to a coating prepared in this embodiment, the thickness of the first sublayer of the absorbing layer is 20 nm, the thickness of the second sublayer is 45 nm, and the thickness of the third sublayer is 60 nm.

Embodiment 6

Refer to the preparation method of the solar selective absorbing coating in embodiment 2 and embodiment 3, according to a coating prepared in this embodiment, the thickness of the first sublayer of the absorbing layer is 30 nm, the thickness of the second sublayer is 60 nm, and the thickness of the third sublayer is 45 nm.

Refer to the preparation method of the solar selective absorbing coating in embodiment 2 and embodiment 3, the substrate of the coating can also be made of copper or stainless steel; the infrared reflective layer can also be made of W, Mo, Au, Ag and/or Ni etc.; and the antireflective layer can also be made of $Al_2O_3$, $ThO_2$, $Dy_2O_3$, $Eu_2O_3$, $Gd_2O_3$, $Y_2O_3$, $La_2O_3$, MgO and/or $Sm_2O_3$ etc.

Performance tests of the coating:

the absorptance α in the band from 0.3 μm to 2.5 μm for the coating prepared in embodiment 2 and embodiment 3 is tested by using a Hitachi U-4100 spectrophotometer, the emittance ε in the band from 2.5 μm to 48 μm for the coating prepared in embodiment 2 and embodiment 3 is tested by using a Bruker Tensor27 Fourier infrared spectrometer, and the testing results are shown in Table 1.

The absorptance α and the emittance ε of the coating prepared in embodiment 2 after annealing at 250° C., 400° C. and 500° C. for different times are detected, and the results are shown in Table 2.

TABLE 1

Absorptance and emittance of the selective absorbing coating prepared in embodiment 2 and 3

| | 80° C. | | |
|---|---|---|---|
| | α | ε | α/ε |
| embodiment 2 | 96.13% | 4.59% | 20.9 |
| embodiment 3 | 96.95% | 4.28% | 22.7 |

As shown in Table 1, the absorptances α of the selective absorbing coating prepared in embodiment 2 and embodiment 3 are up to 96.13% and 96.95%, respectively, and the emittance ε is lower than 5%, which demonstrates that the selective absorbing coating prepared in embodiment 2 and 3 has high absorptance α and low emittance.

TABLE 2

Absorptance and emittance of the coating after treatment in different conditions in embodiment 2

| | | 80° C. | | |
|---|---|---|---|---|
| | treatment | α | ε | α/ε |
| embodiment 2 | untreated | 96.13% | 4.59% | 20.9 |
| | 250° C.@200 h | 95.94% | 4.41% | 21.8 |
| | 400° C.@420 h | 95.76% | 3.74% | 25.6 |
| | 500° C.@8 h | 95.73% | 4.75% | 20.2 |

Figure 2:
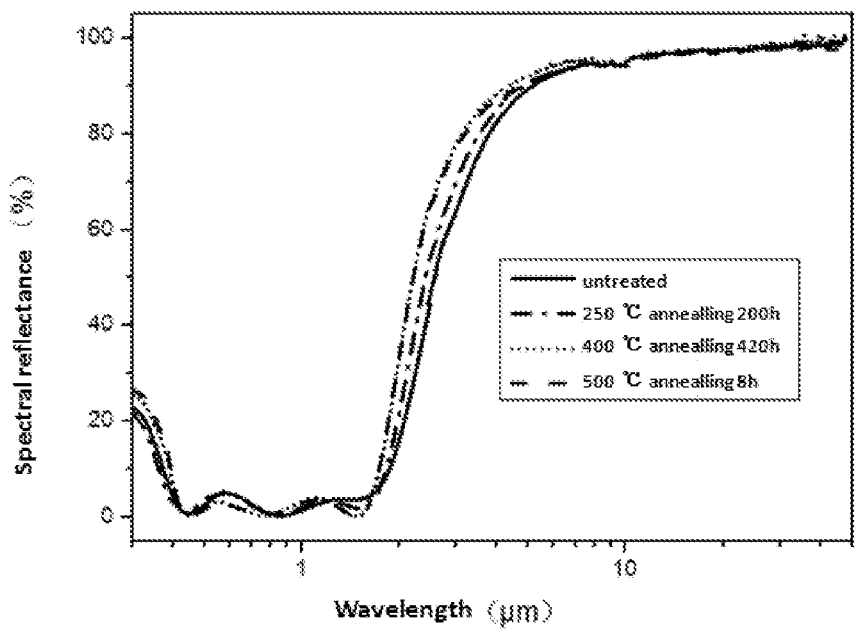
FIG. 2 is spectral curves of a mid-high temperature solar selective absorbing coating of the present invention without annealing and after annealing in an atmospheric environment at 250° C., 400° C. and 500° C.

As shown in Table 2, after annealing at 250° C. for 200 hours and 400° C. for 420 hours in the atmospheric environment, the absorptance α of the coating prepared in embodiment 2 is still up to 95.76%, the emittance ε is 3.74%, and α/ε rises to 25.6; and after annealing at 500° C. for 8 hours in the atmospheric environment, the absorptance α of the coating is still up to 95.73%, the emittance ε is 4.75%, and a/c is 20.2. The selective absorbing coating prepared in embodiment 2 has good thermal stability performance and still keeps excellent spectral selectivity after annealing at 500° C. in the atmospheric environment. The spectral curves of the solar selective absorbing coating prepared in the embodiment without annealing and after annealing in the atmospheric environment at 250° C., 400° C. and 500° C. are shown in FIG. 2.

The performance tests of the coating prepared by other embodiments of the present invention are similar to the performance of the coating prepared in embodiment 2 and embodiment 3.

The above descriptions are only preferred embodiments of the present invention, and are not intended to limit the present invention in any form, any simple modification and equivalent change and modification to the embodiments according to the technical essence of the present invention are within the scope of the technical solutions of the present invention.

The invention claimed is:

1. A solar selective absorbing coating, comprising:
    a substrate, an infrared reflective layer, an absorbing layer and an antireflective layer in sequence from bottom to surface; wherein
    the absorbing layer comprises a first sublayer, a second sublayer and a third sublayer, the first sublayer is metal nitride, the second sublayer is metal nitride, and the third sublayer is metal oxynitride; and
    the first sublayer is in contact with the infrared reflective layer, and the third sublayer is in contact with the antireflective layer,
    wherein:
    the first sublayer is metal nitride with incomplete nitridation, the second sublayer is metal nitride, and the third sublayer is metal oxynitride,
    the first sublayer is $CrN_x$, wherein 0<x<1, and x is the atom number ratio of element N to element Cr;
    the second sublayer is $CrN_y$, wherein 1<y≤1.5, and y is the atom number ratio of element N to element Cr; and
    the third sublayer consists of $CrN_mO_n$, wherein 0<m≤1.5, 0<n≤2, m is the atom number ratio of element N to element Cr, and n is the atom number ratio of element O to element Cr.

2. The solar selective absorbing coating of claim 1, wherein,
    the thickness of the first sublayer is 20-40 nm;
    the thickness of the second sublayer is 25-60 nm; and
    the thickness of the third sublayer is 30-60 nm.

3. The solar selective absorbing coating of claim 1, wherein,
    the substrate is made of glass, aluminum, copper, or stainless steel;
    the infrared reflective layer is one or a combination of two or more selected from a group consisting of Al, Cu, W, Mo, Au, Ag, and Ni; and
    the antireflective layer is one or a combination of two or more selected from a group consisting of $SiO_2$, $Si_3N_4$, $Al_2O_3$, $ThO_2$, $Dy_2O_3$, $Eu_2O_3$, $Gd_2O_3$, $Y_2O_3$, $La_2O_3$, MgO and $Sm_2O_3$.

4. The solar selective absorbing coating of claim 1, wherein,
    the thickness of the infrared reflective layer is 80-200 nm;
    the thickness of the absorbing layer is 75-160 nm; and
    the thickness of the antireflective layer is 50-150 nm.

5. A method of making the solar selective absorbing coating of claim 1, comprising:
    depositing the infrared reflective layer on the substrate;
    depositing the absorbing layer on the infrared reflective layer, and
    depositing the antireflective layer on the absorbing layer;
    wherein the absorbing layer comprises the first sublayer, the second sublayer and the third sublayer, the first sublayer and the second sublayer contain metal nitride, and the third sublayer is metal oxynitride.

6. The method of claim 5, wherein,
    the infrared reflective layer is deposited on the substrate through pulsed direct current magnetron sputtering in an inert gas condition;

the first sublayer of the absorbing layer is deposited on the infrared reflective layer through pulsed direct current magnetron sputtering with feeding of nitrogen in the inert gas condition;

the second sublayer of the absorbing layer is deposited on the first sublayer through pulsed direct current magnetron sputtering with feeding of nitrogen in the inert gas condition;

the third sublayer of the absorbing layer is deposited on the second sublayer through pulsed direct current magnetron sputtering with feeding of nitrogen and oxygen in the inert gas condition; and the antireflective layer is deposited on the third sublayer through pulsed direct current magnetron sputtering with feeding of nitrogen or oxygen in the inert gas condition.

7. The method of claim 6, wherein,
the inert gas is argon.

* * * * *